(12) United States Patent  
Staerzl

(10) Patent No.: US 6,559,660 B1
(45) Date of Patent: May 6, 2003

(54) METHOD AND APPARATUS FOR TESTING AN ELECTRICAL SYSTEM OF A MARINE VESSEL

(75) Inventor: Richard E. Staerzl, Fond du Lac, WI (US)

(73) Assignee: Brunswick Corporation, Lake Forest, IL (US)

( * ) Notice: Subject to any disclaimer, the term of this patent is extended or adjusted under 35 U.S.C. 154(b) by 0 days.

(21) Appl. No.: 09/933,440

(22) Filed: Aug. 20, 2001

(51) Int. Cl.[7] .............................................. G01R 27/08
(52) U.S. Cl. .................... 324/712; 205/740; 204/196.01
(58) Field of Search ................... 205/726, 740, 205/775.5; 204/404, 406, 407, 196.01, 196.21, 196.26, 196.36, 196.37; 324/700, 705, 706, 710, 712, 713, 718

(56) References Cited

U.S. PATENT DOCUMENTS

| | | | |
|---|---|---|---|
| 3,953,742 A | 4/1976 | Anderson et al. ............. 307/95 |
| 4,492,877 A | 1/1985 | Staerzl ......................... 307/95 |
| 4,730,156 A * | 3/1988 | Matsuda ...................... 324/73 R |
| 4,992,920 A * | 2/1991 | Davis ............................ 363/36 |
| 5,032,095 A | 7/1991 | Ferguson et al. ............. 440/89 |
| 5,298,794 A | 3/1994 | Kuragaki ....................... 307/95 |
| 5,488,300 A * | 1/1996 | Jamieson ..................... 324/432 |
| 5,747,892 A * | 5/1998 | Staerzl ......................... 307/95 |
| 5,748,008 A * | 5/1998 | Landreth ...................... 324/763 |
| 5,840,164 A | 11/1998 | Staerzl ......................... 204/196 |
| 6,183,625 B1 | 2/2001 | Staerzl ......................... 205/727 |
| 6,265,879 B1 * | 7/2001 | Landreth ...................... 324/537 |
| 6,331,243 B1 * | 12/2001 | Lewis ........................... 205/727 |
| 6,459,175 B1 * | 10/2002 | Potega ......................... 307/149 |

* cited by examiner

Primary Examiner—Safet Metjahic
Assistant Examiner—Etienne P LeRoux
(74) Attorney, Agent, or Firm—William D. Lanyi

(57) ABSTRACT

A monitoring circuit is provided to determine the proper operating condition of a cathodic protection circuit including a plurality of diodes and a capacitor. The monitoring circuit determines whether or not any of the diodes are shorted or open and whether or not the capacitor is open or operating properly. In addition, it determines whether or not the cathodic protection circuit is properly connected between a boat ground point and a shore ground point.

14 Claims, 8 Drawing Sheets

METHOD AND APPARATUS FOR TESTING AN ELECTRICAL SYSTEM OF A MARINE VESSEL

BACKGROUND OF THE INVENTION

1 Field of the Invention

The present invention is generally related to a method or system for testing a marine vessel's electrical circuit and, more particularly, for detecting and identifying certain specific types of fault conditions relating to a galvanic corrosion protection circuit.

2 Description of the Prior Art

It is well known to those skilled in the art of marine vessels and marine propulsions systems that galvanic corrosion can result from connecting the marine vessel to a shore power system without appropriate protection. Several types of cathodic protection devices are commercial available. One such type of device is available in commercial quantities from the Mercury Marine division of the Brunswick Corporation and is referred as a mercathodic system.

As is also well known to those skilled in the art, faulty components in the electrical system of a marine vessel or its cathodic protection device can result in either galvanic corrosion or a dangerous condition.

U.S. Pat. No. 5,748,008, which issued to Landreth on May 5, 1998, describes an electrical integrity test system for boats. An electrical integrity test system for boats provides circuitry for evaluating the integrity of the boat's electrical distribution AC grounding system when the boat is connected to a dock's electrical distribution system, and the integrity of the boat's galvanic isolator. The electrical integrity test system also includes a polarity detecting circuit that will activate an alarm when it detects a dock's hot and neutral conductors to be reversed. Additionally, the electrical integrity test system includes an AC ground current detecting circuit that continuously monitors the boat's AC grounding conductor for the presence of AC current. A system controller controls selected functions and sequence of functions of the described circuits. If the test system detects the AC grounding system or the boat's galvanic isolator is faulty or the dock's hot and neutral conductors are reversed or AC current flowing in the boat's AC grounding conductor, it will activate an alarm to apprise the boat operator of the faulty condition.

U.S. Pat. No. 3,953,742, which issued to Anderson et al on Apr. 27, 1976, discloses a cathodic protection monitoring apparatus for a marine propulsion device. A cathodic protection system monitor is coupled to an impressed current cathodic protection circuit used for corrosion protection of a submerged marine drive. The cathodic protection circuit includes one or more anodes and a reference electrode mounted below the water line and connected to an automatic controller for supplying an anode current which is regulated in order to maintain a predetermined reference potential on the protected structure. A switch selectively connects a light emitting diode (LED) lamp or other light source between the controller output and ground so that the controller current may, when tested, be used to operate the light source in order to confirm that power is available to the anode.

U.S. Pat. No. 4,492,877, which issued to Staerzl on Jan. 8, 1985, discloses an electrode apparatus for cathodic protection. An electrode apparatus includes an insulating housing on which the anode and reference electrode are mounted and a copper shield mounted between the anode and electrode to allow them to be mounted in close proximity to each other. The shield is electrically connected to the device to be protected and serves to match the electrical field potential at the reference electrode to that of a point on the outboard drive unit remote from the housing.

U.S. Pat. No. 5,747,892, which issued to Staerzl on May 5, 1998, discloses a galvanic isolator fault monitor. A system and method for testing and monitoring the operation of a galvanic isolator is disclosed and illustrated. The galvanic isolator is positioned between the shore ground and boat ground to prevent the flow of destructive galvanic currents between the shore ground and the boat ground. The monitoring system transmits a test current through the galvanic isolator at specific time intervals to test the effectiveness of the galvanic isolator. The monitoring system includes a first counter that outputs an enabling signal after a desired period of time. The enabling signal allows a test current to flow through the galvanic isolator for a brief period of time. The enabling signal allows a test current to flow through the galvanic isolator for a brief period of time determined by a second counter. As the test current flows through the galvanic isolator, a current sensing circuit measures the test current and activates an alarm if the test current flowing through the galvanic isolator falls outside a predetermined range. In this manner, the monitoring system monitors and periodically tests a galvanic isolator.

U.S. Pat. No. 5,840,164, which issued to Staerzl on Nov. 24, 1998, discloses a galvanic isolator. The isolator protects against galvanic corrosion of a submersible metal marine drive. The galvanic isolator is positioned between shore ground and boat ground to prevent the flow of destructive galvanic currents between the shore ground and the boat ground while maintaining the safety function of a neutral ground. The galvanic isolator of the invention includes a blocking element positioned between the boat ground and the shore ground that can be switched between an open and a closed state by a trigger circuit. The trigger circuit closes the blocking element when the voltage difference between the boat ground and the shore ground exceeds a threshold value, such as 1.4 volts. During operation of the galvanic isolator during the high fault current situation, power is dissipated only the blocking element, rather than by the combination of the blocking element and trigger device. In this manner, the galvanic isolator reduces the amount of power dissipated during high current conditions and therefore reduces the amount of heat generated by the galvanic isolator.

U.S. Pat. No. 6,183,625, which issued to Staerzl on Feb. 6, 2001, discloses a marine galvanic protection monitor. A galvanic monitor system uses two annunciators, such like light emitting diodes, to alert a boat operator of the current status of the boat's galvanic protection system. A reference electrode is used to monitor the voltage potential at a location in the water and near the component to be protected. The voltage potential of the electrode is compared to upper and lower limits to determine if the actual sensed voltage potential is above the lower limit and below the upper limit. The two annunciator lights are used to inform the operator if the protection is proper or if the component to be protected is either being over protected or under protected.

U.S. Pat. No. 5,032,095, which issued to Ferguson et al on Jul. 16, 1991, describes a marine engine with galvanic circuit protection which comprises an engine including a coolant jacket and an exhaust port, an exhaust gas discharge system including an exhaust gas manifold communicating with the exhaust port, a high-rise elbow communicating with the exhaust gas manifold, and an exhaust pipe communicating with the high-rise elbow and adapted to convey exhaust gas to an overboard discharge, a high-rise elbow and exhaust gas manifold coolant jacket surrounding the exhaust gas manifold and at least partially surrounding the high-rise elbow and communicating with the exhaust pipe for discharge of coolant from the high-rise elbow and exhaust gas manifold coolant jacket and through the exhaust pipe to an overhead discharge, which high-rise elbow and exhaust gas manifold coolant jacket includes a coolant discharge surface over which coolant is discharged from the high-rise elbow and exhaust gas manifold coolant jacket for flow to the exhaust pipe, a coolant conduit communicating between the engine coolant jacket and the high-rise elbow and exhaust gas manifold coolant jacket and including a portion extending at least as high as the discharge surface of the high-rise elbow and exhaust gas manifold coolant jacket and over which coolant flows, and a supply conduit for supplying coolant to the engine coolant jacket in response to engine operation.

U.S. Pat. No. 5,298,794, which issued to Kuragaki on Mar. 29, 1994, describes an electrical anticorrosion device for a marine propulsion device. The device primarily relates to an electrical anticorrosion device for a marine propulsion arrangement. More particularly, the invention relates to a cathodic protection arrangement which is suitable for use with an inboard/outboard propulsion unit. According to the invention, an anode and a reference electrode are housed with a housing unit which is mounted upon a propulsion unit mounting bracket. The two electrodes are arranged so that each is essentially equidistant from a point located approximately midway across the lateral width of an outboard drive unit, which unit is secured to the mounting bracket when the unit is positioned for driving the associated watercraft in a generally forward direction. The electrode housing further serves as a low speed/idle exhaust gas device which breaks up exhaust gas bubbles which otherwise might cause loud and objectionable noise. Thus, the invention allows for the effective prevention of cathodic corrosion by insuring that a proper current is supplied to a sacrificial anode and, additionally, allows for improved silencing for the low speed/idling exhaust gases of an inboard/outboard drive unit.

The patents described above are hereby expressly incorporated by reference in the description of the present invention.

The proper and safe operation of a marine vessel, when connected electrically to a shore power supply, requires that the cathodic protection circuit, or the galvanic corrosion protection circuit, of the marine vessel is operating properly. Proper operation of this circuit requires that all of its included components are operating properly and the circuit is properly connected to boat and shore grounds. It would therefore be significantly beneficial if a monitoring circuit could be provided which rapidly and accurately detects all of the possible faults that can occur with regard to the use of the boat's electrical system.

SUMMARY OF THE INVENTION

The present invention provides a method and apparatus for testing an electrical system which is connectable between a shore power system and an electrical system of a marine vessel. The method of the present invention comprises the steps of causing a voltage potential charge across the circuit, from a first magnitude to a second magnitude and also comprises the step of measuring a first electrical current flowing through the electrical system following a preselected time period subsequent to the causing step. It then performs the step of determining the operating condition of the electrical system as a function of the relative magnitudes of the first electrical current and a predetermined reference magnitude. A particularly preferred embodiment of the present invention further comprises the steps of subsequently reversing the causing step by inducing the voltage potential across the electrical system to change from the second magnitude to the first magnitude. The method then measures a second electrical current flowing through the electrical system following said preselected time period subsequent to the reversing step and determines the operating condition of the electrical system as a function of the relative magnitudes of the second electrical current and the predetermined reference magnitude.

The predetermined reference magnitude is selected, in various embodiments of the present invention, to identify a shorted diode, an open diode, an open ground connection, and an open capacitor. The causing, measuring, and determining steps are performed by a microprocessor in a preferred embodiment of the present invention. In addition, the reversing step and the second electrical current measuring step is performed by a microprocessor.

An apparatus for performing the method of the present invention comprises a first circuit point and a second circuit point which are connectable, respectively, to the electrical circuit of the marine vessel and to a shore power system. A power supply is configured to provide a DC voltage of a preselected magnitude. A switching circuit is connected in electrical communication with the power supply and with the first and second circuit points and the switching circuit is configured to cause the preselected voltage magnitude to be imposed across the first and second circuit points in either of two polarities. A microprocessor is connected in electrical communication with the switching circuit to control the selection of the two polarities. A reference component is connected in electrical communication with the switching circuit and in series with the electrical system. The reference component provides a signal which is representative of an electrical current flowing through the electrical system. A preferred embodiment of the present invention selects the preselected reference magnitude to monitor the integrity of the ground connection between the marine vessel and the shore power system, the integrity of the capacitor, and the integrity of the plurality of diodes. In a preferred embodiment, the reference component is a resistor and the signal which is representative of an electric current flowing through the electrical system is a voltage drop across the resistor which is measured by the microprocessor.

BRIEF DESCRIPTION OF THE DRAWINGS

The present invention will be more fully and completely understood from a reading of the description of the preferred embodiment in conjunction with the drawings, in which.

DESCRIPTION OF THE PREFERRED EMBODIMENT

Figure 1:
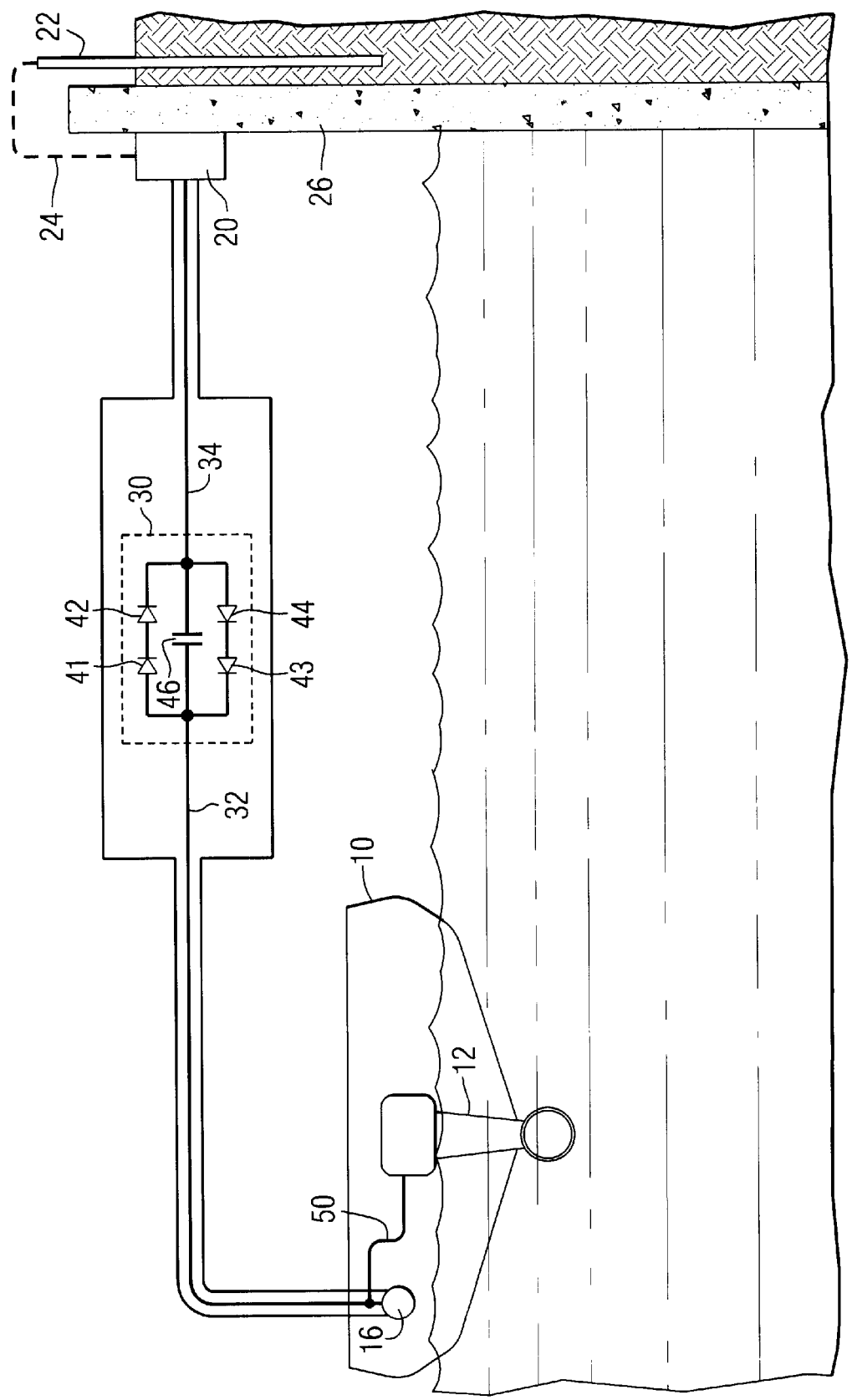
FIG. 1 shows an arrangement of a marine vessel and a shore power source in conjunction with a cathodic protection circuit as is well known to those skilled in the art.

Throughout the description of the preferred embodiment of the present invention, like components will be identified by like reference numerals.

FIG. 1 is schematic representation of a marine vessel 10 with a marine propulsion system 12. The marine vessel 10 has an electrical system 16 which is connected in electrical communication with a shore power system 20 in a manner which is well known to those skilled in the art. The shore power system 20 is typically grounded through the use of a grounding rod 22 connected to a ground connection of the shore power system 20 as illustrated by a dashed line connection 24. In addition, a metallic piling or sea wall 26 typically provides an electrical grounding connection, between the shore and the water in which the marine vessel 10 is operating.

In FIG. 1, a cathodic protection system 30 is connected in electrical communication between the ground wire 32 of the electrical system 16 of the marine vessel 10 and the ground wire 34 of the shore power system 20. The cathodic protection system comprises a first set of diodes (e.g. diodes 41 and 42) and a second set of diodes (e.g. diodes 43 and 44) connected in combination with a capacitor 46. This arrangement of components of the cathodic protection circuit 30 is well known to those skilled in the art and will not be described in detail herein. Cathodic protection systems like that represented within the dashed line box of FIG. 1, and identified by reference numeral 30, are available in commercial quantities.

With continued reference to FIG. 1, the marine propulsion system 12 is connected electrically to the boat ground 32 by connection line 50. If any of the components of the cathodic protection circuit 30 fails, the effectiveness of the protection circuit will be severely diminished. In addition, if the cathodic protection circuit 30 is improperly connected to the boat ground 32 or the shore ground 34, its operation will be seriously compromised. The failure of components or the incorrect connection of the cathodic protection circuit 30 can result in personal injury or serious property damage. The purpose of the present invention, as will be described in greater detail below, is to provide an effective monitoring circuit which quickly and accurately reacts to a failure or misconnection of the cathodic monitoring system 30 and its internal components.

Figure 2:
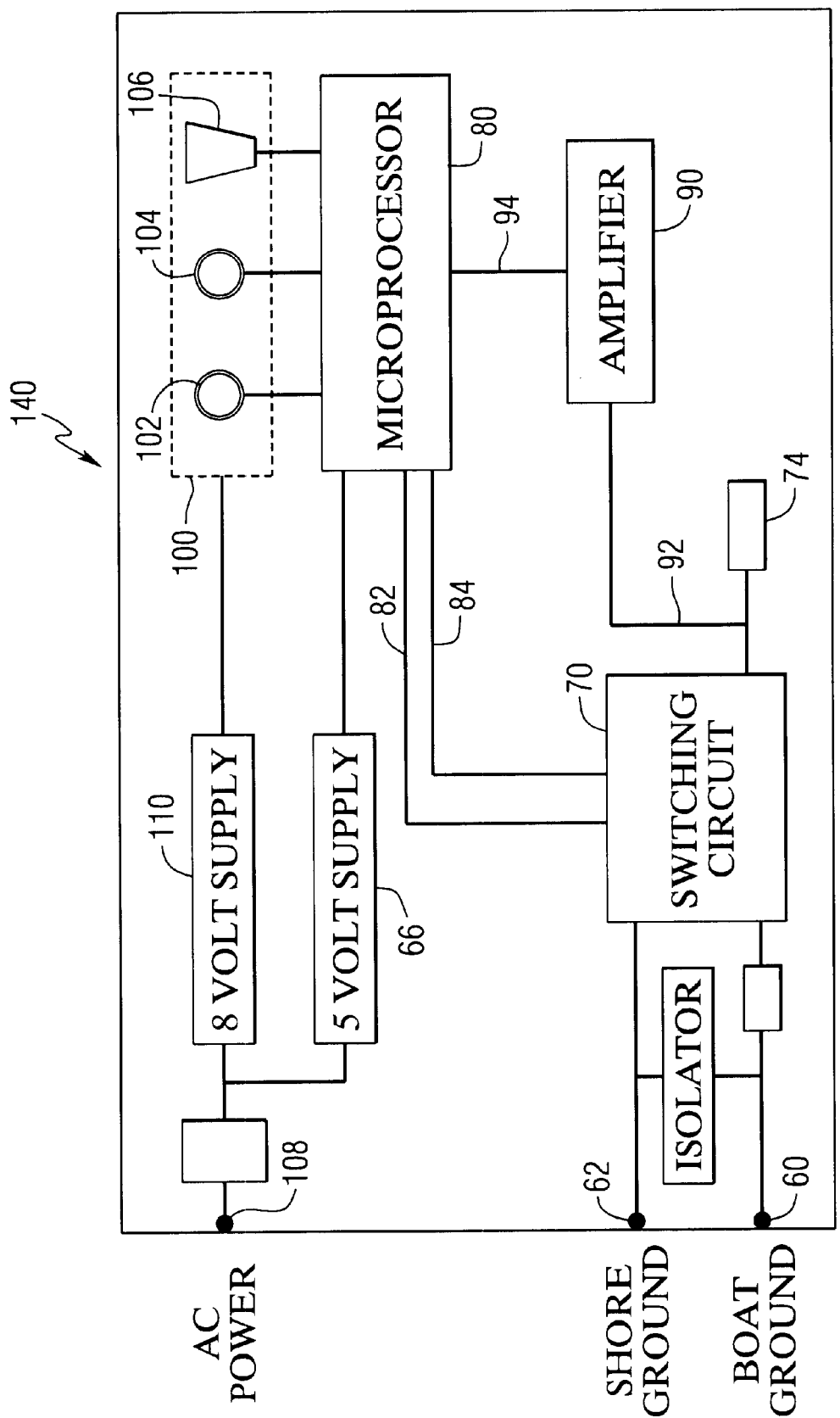
FIG. 2 is a simplified electrical schematic of a circuit used to implement the present invention.

The apparatus of the present invention is illustrated schematically in FIG. 2. It comprises a first circuit point 60 which is connectable to the electrical circuit of a marine vessel. In other words, it is connectable to the boat ground 32. A second circuit point 62 is connectable to the shore power system. In other words, it is connectable to the shore ground 34 described above. In a typical application of the present invention, the isolator shown connected between points 60 and 62 is not part of the circuit 140, itself, but is connected between circuit points 60 and 62 at a location external to the circuit 140. Although this isolator can be physically separated from the other components of the circuit 140, its function is the same as represented in FIG. 2. A power supply 100 is configured to provide a DC voltage of a preselected magnitude, such as eight volts DC. A switching circuit 70 is connected in electrical communication with the power supply and with the first and second circuit points, 60 and 62. Although the connection between the switching circuit 70 and the power supply 100 is not explicitly shown in FIG. 2, it should be understood that the connection between the switching circuit 70 and the power supply 100 is provided through a reference component 74 which, in turn, is connected to a circuit ground of the electrical circuit shown in FIG. 2. The switching circuit 70, which can be an H-bridge circuit, is configured to cause a preselected voltage magnitude providing by the power supply 100 to be imposed across the first and second circuit points, 60 and 62, in either of two opposite polarities. The switching circuit 70 can then reverse the polarity to reverse the voltage potential between the boat ground 60 and the shore ground 62.

With continued reference to FIG. 2, a microprocessor 80 is connected in electrical communication with the switching circuit 70, as represented by lines 82 and 84, in order to allow the microprocessor 80 to control the selection of the two possible connection polarities between the boat ground 32 and shore ground 34 and the power supply 66. The reference component 74 is connected in electrical communication with the switching circuit 70 and in series with the electrical system of the marine vessel, which is connectable between the boat ground 60 and the shore ground 62 as will be described in greater detail below. The reference component 74, which can be a reference resistor, provides a signal which is representative of an electrical current flowing through the electrical system of the marine vessel, between the boat ground connection point 60 and the shore ground connection point 62, and the reference component 74 is connected in electrical communication with the microprocessor 80 so that the microprocessor can determine the magnitude of current flowing through the electrical system connected between circuit points 60 and 62.

As shown in FIG. 2, an amplifier 90 is provided to amplify the signal received on line 92 and provide an amplified signal on line 94 to the microprocessor. In a preferred embodiment of the present invention, the signal receives by the amplifier 90 on line 92 is representative of the voltage drop across a reference resistor which is used as the reference component 74.

The microprocessor 80 is configured to compare the signal received on line 94 to a predetermined reference magnitude which allows the microprocessor 80 to compare the current signal received on line 94 to the reference magnitude in order to determine the operational status of the marine vessel's electrical system.

With continued reference to FIG. 2, an annunciator device 100 provides a green LED 102, a red LED 104, and a horn 106 which allows the microprocessor to alert the marine vessel operator if the electrical system of the marine vessel 10 is not in proper operating condition. In other words, the components of the cathodic protection circuit 30 are monitored along with the connection of the cathodic protection system 30 to the boat ground 32 and shore ground 34. If any one of a plurality of fault conditions is detected, the microprocessor 80 uses the annunciator device 100 to alert the operator of this fact.

Figure 3:
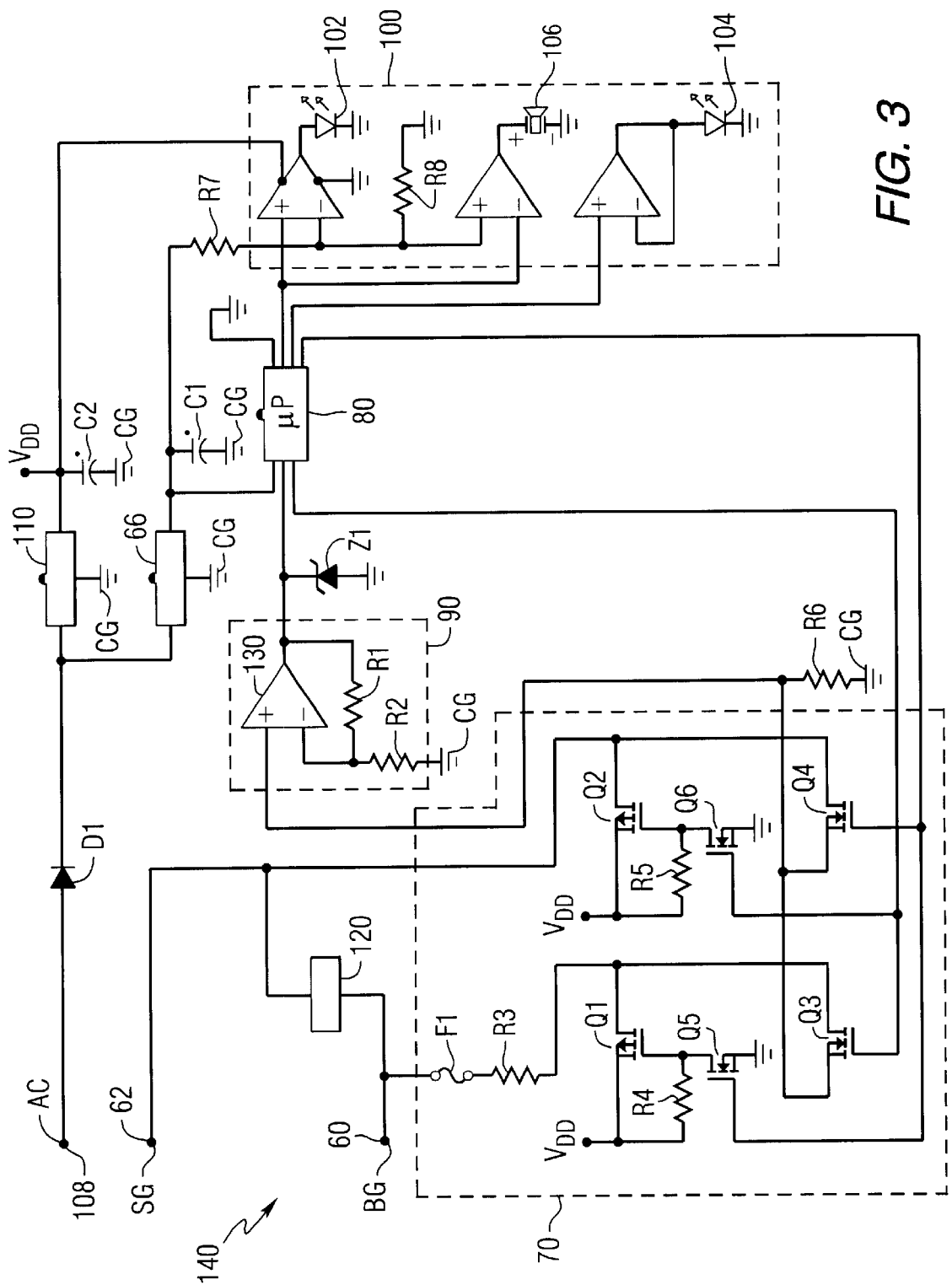
FIG. 3 is a more detailed electrical schematic of the circuit of FIG. 2.

FIG. 3 is an electrical schematic diagram of a circuit which performs the intended function of the present invention. AC power is received at point 108 and is converted by power supplies 66 and 110 to DC power at 5 volts and 8 volts magnitudes, respectively. The 8 volt power supply 110 is used to power the annunciator device 100 and switching circuit 70. It should also be understood that the circuit ground symbols CG used throughout the schematic diagram of FIG. 3 represent the interconnection of the components shown in FIG. 3 and do not represent a ground connection to either the boat ground 32 or the shore ground 34. Furthermore, it should be understood that the connection point 108 to the AC power supply, used to provide power to the circuit of FIG. 3, is connected through an isolating device, such as a transformer, to avoid any connection between the components shown in FIG. 3 and either the boat ground 32 or the shore ground 34. The components identified in FIG. 3 are shown in Table I along with their values or type identifications. It should be understood that various other combinations of components can be used to perform the function of the present invention. The amplifier components 130 of the amplifier 90 is identified as type LM324, along with the three amplifier components used in conjunction with the annunciator device 100. All of the components shown in FIG. 3 are available in commercial quantities and their individual functions are well understood by those skilled in the art. Therefore, the individual operation of each of the components in FIG. 3 will not be described in detail herein. Reference numeral 140 is used throughout this description to identify the circuit of the present invention.

TABLE I

| REFERENCE | COMPONENT TYPE OR VALUE |
|---|---|
| R1 | 1,000 kΩ |
| R2 | 15 kΩ |
| R3 | 5 Ω |
| R4 | 10 kΩ |
| R5 | 10 kΩ |
| R6 | 0.2 Ω |
| R7 | 10 kΩ |
| R8 | 10 kΩ |
| C1 | 10 μF |
| C2 | 10 μF |
| D1 | 1 A |
| Z1 | 4.7 volts (1N5230) |
| Q1 | 1RF9540 |
| Q2 | 1RF9540 |
| Q3 | MTP3055V |
| Q4 | MTP3055V |
| Q5 | 2N7000 |
| Q6 | 2N7000 |

Figure 4:
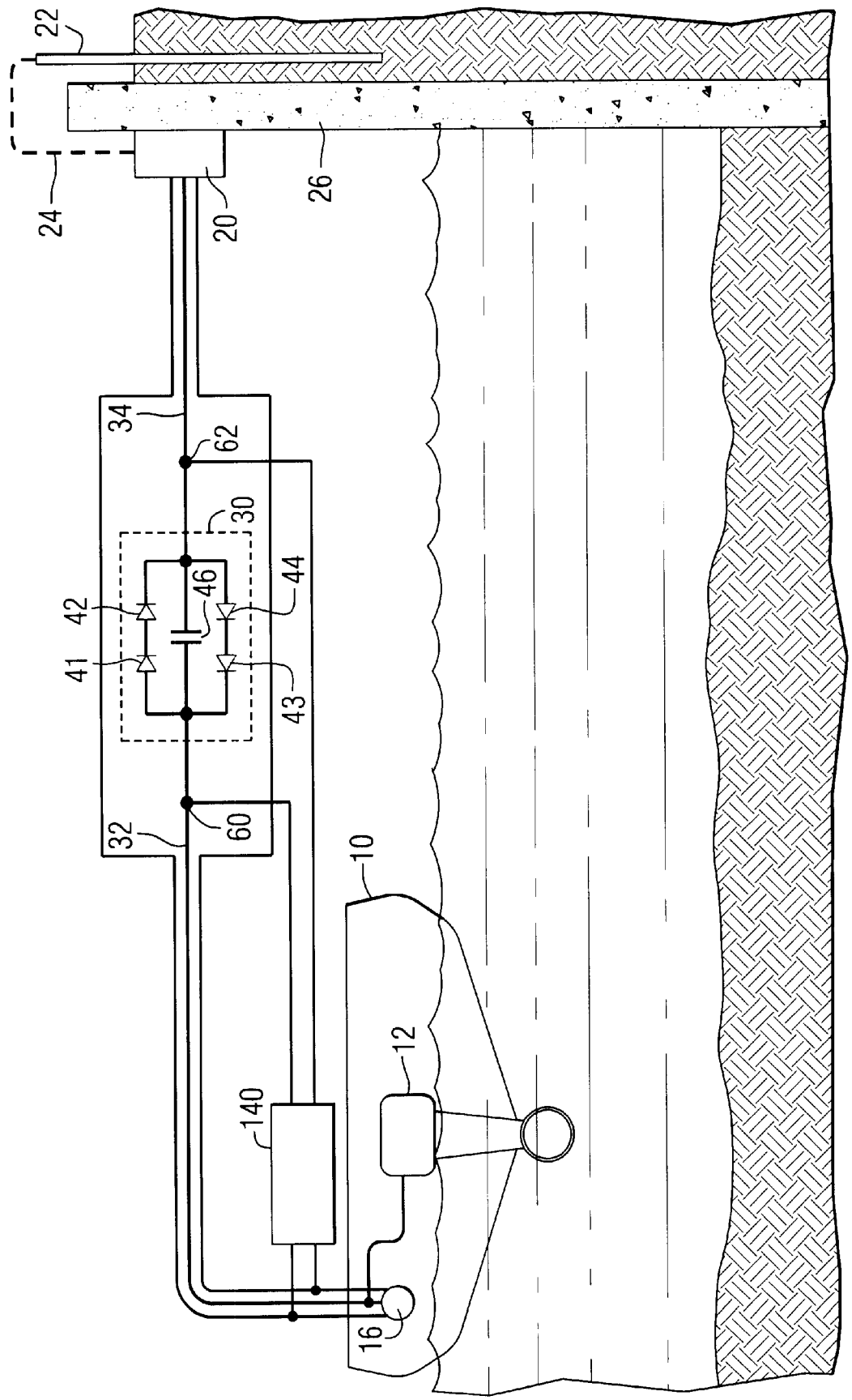
FIG. 4 shows the arrangement of FIG. 1 with the present invention connected to the cathodic protection circuit.

FIG. 4 is generally similar to FIG. 1, but with the circuit of the present invention 140 connected to the boat ground 32 and the shore ground 34 at points 60 and 62, respectively. The present invention is intended to be connected to opposite sides of the cathodic protection circuit 30 in order to monitor the current flowing through the cathodic protection circuit 30 by imposing a voltage across the cathodic protection circuit and then changing that voltage. It should be understood that it is the sudden change in the voltage magnitude that provides the detectable current pulse which the present invention uses to determine the operating condition of the circuit 30.

Figure 5:
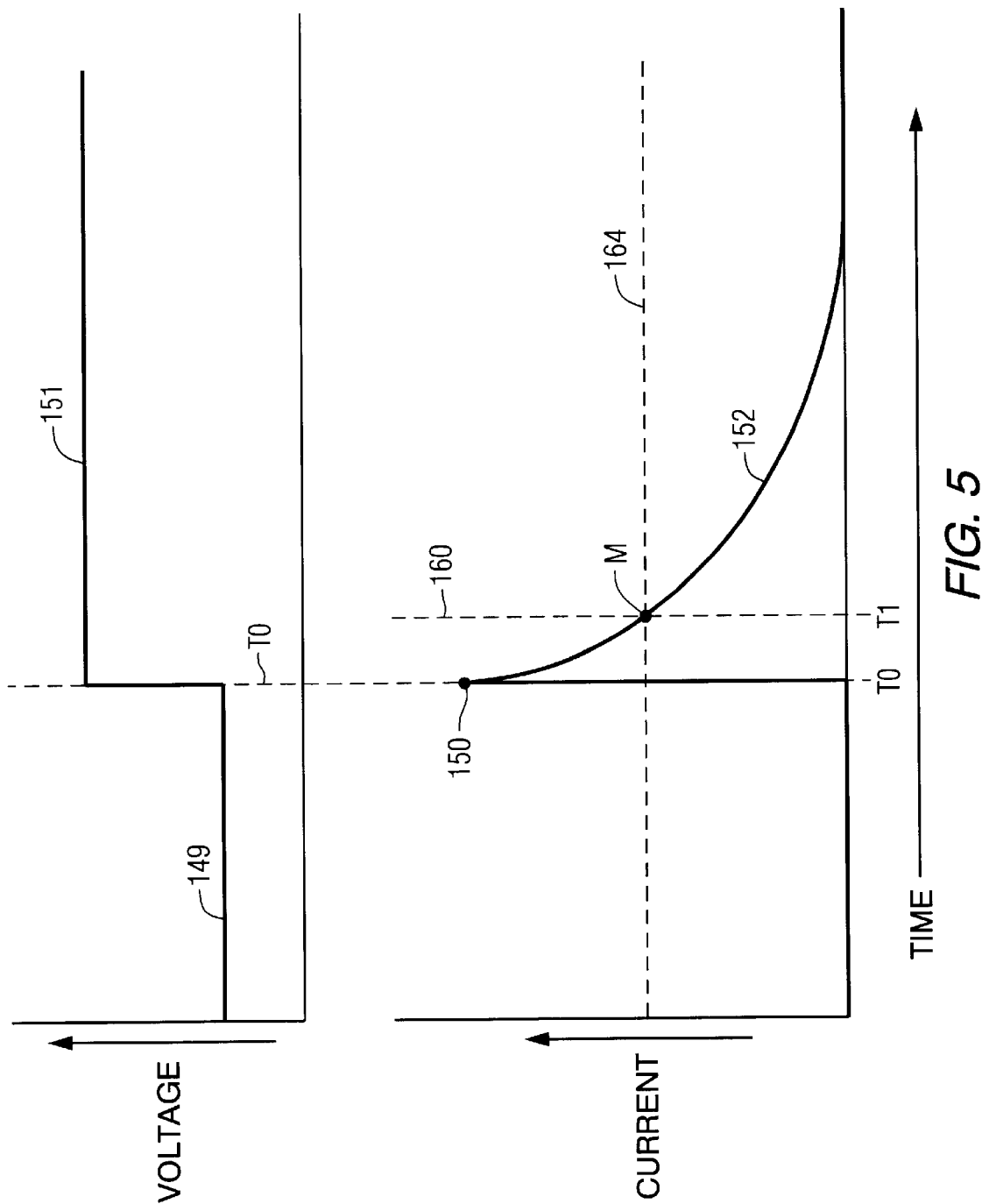
FIG. 5 shows a typical current response curve for a capacitive circuit.

In order to more clearly understand the operation of the present invention, FIG. 5 is provided to show a typical current waveform that results when a voltage change is imposed across a circuit having a capacitor as one of its components. In the upper portion of FIG. 5, a voltage magnitude across the circuit is changed from a first magnitude 149 to a second magnitude 151. That magnitude change occurs at time T0. Although the magnitude change from the first magnitude 149 to the second magnitude 151 shows an increase in the value of the voltage potential at time T0, it should be understood that a change can be caused by the present invention in the opposite direction. In fact, the preferred embodiment of the present invention subsequently reverses the conditions by suddenly changing the voltage potential across the circuit being tested from the second magnitude 151 back to the first magnitude 149. The reversal in polarity of the voltage potential across the circuit being tested will result in a current flowing in the opposite direction. However, the basic premises of the present invention can be used under both circumstances. By changing the voltage potential in one direction and then reversing the procedure, the circuit being tested can be more fully and completely tested to ascertain the proper operating condition of its individual components and its connection to the boat ground and shore ground. If the voltage change is suddenly imposed across the capacitive circuit at time T0, a current inrush will occur and the current magnitude will rise to a first point 150. Then, depending on the values of the selected components in the capacitive circuit, the current magnitude will decrease along a characteristic curve 152. The basic shape of curve 152 is that which is typical in a capacitive circuit subsequent to a change in voltage across the circuit.

With continued reference to FIG. 5, it can be seen that if the current magnitude is measured at a preselected time duration subsequent to time T0, such as that represented by dashed line 160, a decreasing current value will be measured. The magnitude M of this current measured at time T1 is represented by dashed line 164. In other words, if a voltage change is imposed across a capacitive circuit at time T0, the current flowing through that capacitive circuit will rise suddenly to point 150 and then decrease along the characteristic curve 152. If the current magnitude is measured at a preselected time subsequent to time T0, such as that represented at time T1 by dashed line 160, a current magnitude M of a value represented by line 164 will be measured. The basic concept of the decreasing current represented by curve 152, subsequent to an initial change in voltage potential across the capacitive current, is used by the present invention to monitor and evaluate the operability of the various components of the cathodic protection circuit 30 and, in addition, to evaluate the connection between the boat ground 32 and the shore ground 34. These evaluations will be described in greater detail below.

Figure 6A:
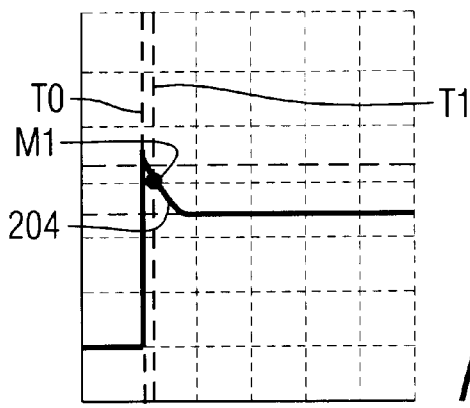
FIGS. 6A–6D show various current waveforms used in the operation of the present invention.

FIGS. 6A–6D represent various conditions under which the present invention can identify certain fault situations. It should be understood that FIGS. 6A–6D share a common horizontal axis of time. Throughout the discussion of FIGS. 6A–6D and the subsequent discussion of FIGS. 7A–7C, it should be understood that in each circumstance represented by each of the Figures, the present invention causes a sudden voltage change to occur across the circuit being tested at time T0. Throughout the description of FIGS. 6A–6D and 7A–7C, it should also be understood that the change in voltage potential across the circuit being tested can be reversed in polarity. In fact, a preferred embodiment of the present invention does reverse the polarity as a second step of the testing procedure. However, the reversal of polarity has a similar effect on the circuit being tested, but in an opposite direction. Therefore, the details of the reversing procedures and measuring practices will not be described in significant detail herein. The various tests, which will be described below, typically measure the current at time T1 approximately 10 milliseconds after time T0. However, some of the tests measure the current at a time T1 which is 100 milliseconds after time T0. It has determined that certain tests are more reliable with a 100 millisecond time delay between time T0 and time T1 while others can be satisfactorily completed with a time delay of 10 milliseconds. Curve 204 in FIG. 6A represents the current flowing through the cathodic protection circuit 30 as a result of the sudden change in voltage across circuit points 60 and 62. Although the relative magnitudes of the current peaks of waveform 204 in FIG. 6A are not identical to that represented in the exemplary waveform 152 in FIG. 5, it should be understood that in all of the current graphs described herein, the characteristic shape of line 152 in FIG. 5 is inherent in the waveforms described in later figures. At time T0, the current flowing between circuit points 60 and 62 increases suddenly and then begins to decrease according to the characteristic shape of a capacitive circuit current. If this current magnitude is measured at time T1, a magnitude M1 is obtained. In a prototype circuit of the present invention, using components such as those identified above in conjunction with FIG. 3, a properly configured and connected cathodic protection circuit 30 results in a current magnitude M1 of approximately of 1.61 Amperes. This current magnitude is represented by a signal provided as a voltage drop across the reference component 74 in FIG. 2, which is the reference resistor R6 shown in FIG. 3. The situation represented in FIG. 6A is a normal situation with all of the components of the cathodic protection circuit operating correctly and with the cathodic protection circuit 30 properly connected between both ground 32 and shore ground 34. The current signal eventually decreases to approximately 1.25 Amperes.

Figure 6B:
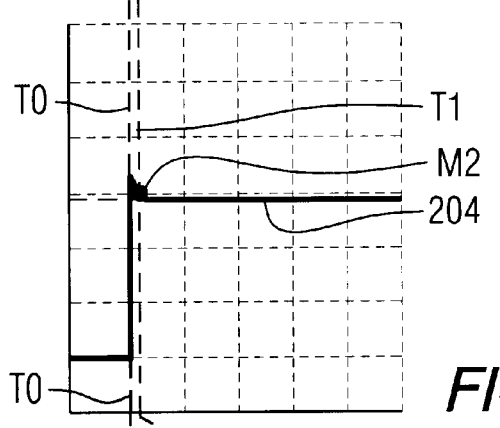

FIG. 6B shows the results of a similar operation, but with one of the diodes, 41–44, shorted. In FIG. 6B, the base level of current 204 between peaks, of approximately 1.40 Amperes, is slightly higher than in FIG. 6A because of the shorted diode. In addition, the current in FIG. 6B rises to a magnitude which is less than that shown in FIG. 6A in response to the sudden change in voltage 200 at time T0. In addition, the current measurement made at time T1, which is represented as M2 in FIG. 6B, is less than magnitude M1. This indicates a shorted diode. As a result, it can be seen that a predetermined reference magnitude of current can be used to distinguish between the conditions shown in FIG. 6A and 6B.

Figure 6C:
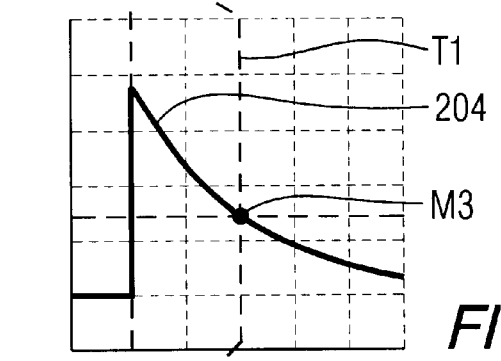

FIG. 6C illustrates the results observed when one of the diodes, 41–44, is in an open condition. The sudden voltage change at time T0 results in a significant change in current 204, followed by the characteristic decrease. In this test for an open diode, time T1 is 100 milliseconds later than time T0 in order to allow for a more accurate and reliable result. The current measured at time T1 as represented by M3 in FIG. 6C, is approximately 0.7 Amperes. This is significantly lower than magnitude M1 which is expected in a normal situation with no failed components.

With reference to FIGS. 6A–6C, it can be seen that a predetermined reference magnitude for reference range around magnitude M1 can be used to distinguish between a shorted diode as represented in FIG. 6B and an open diode as represented in FIG. 6C. Using appropriately selected predetermined reference magnitudes, the result in FIG. 6B can easily be identified as a shorted diode and the result in FIG. 6C can easily be identified as an open diode.

Figure 6D:
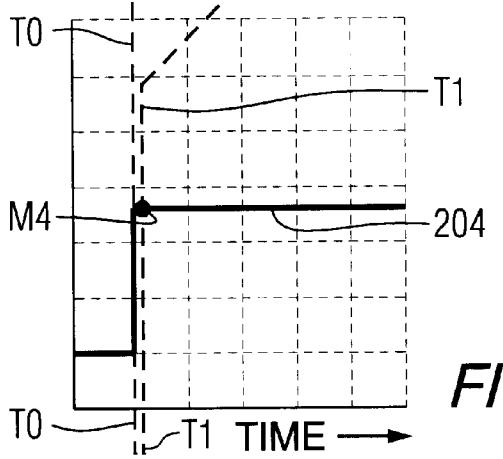

FIG. 6D illustrates a situation in which the capacitor 46 is open in the cathodic protection circuit 30. When the voltage is suddenly changed at time T0, no change in current 204 is sent. As a result, the magnitude of the measured current M2 at time T1 is approximately 1.25 Amperes. If a predetermined reference magnitude, based on magnitude M1 shown in FIG. 6A, is selected, an open capacitor can easily be detected by the present invention.

With reference to FIG. 6A–6D, it can be seen that using the expected magnitudes of the normal current reaction illustrated in FIG. 6A allows the present invention to determine whether or not the diodes of the cathodic protection circuit 30 are shorted or open, as represented in FIGS. 6B and 6C, or whether the capacitor 46 is open as represented in FIG. 6D.

Figure 7A:
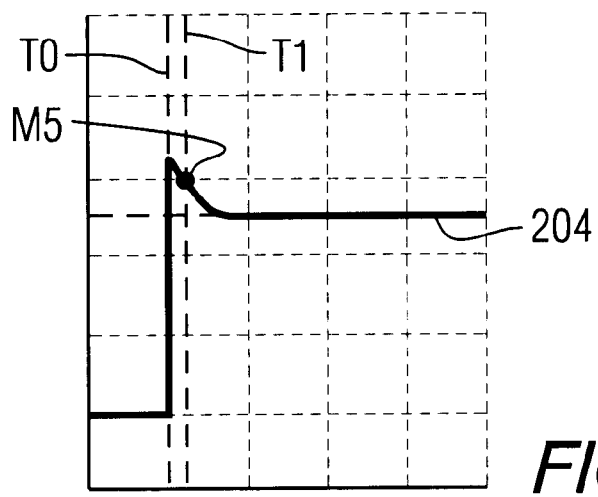
FIGS. 7A–7C show various current waveforms used in the present invention to determine an open ground connection situation.
Figure 7B:
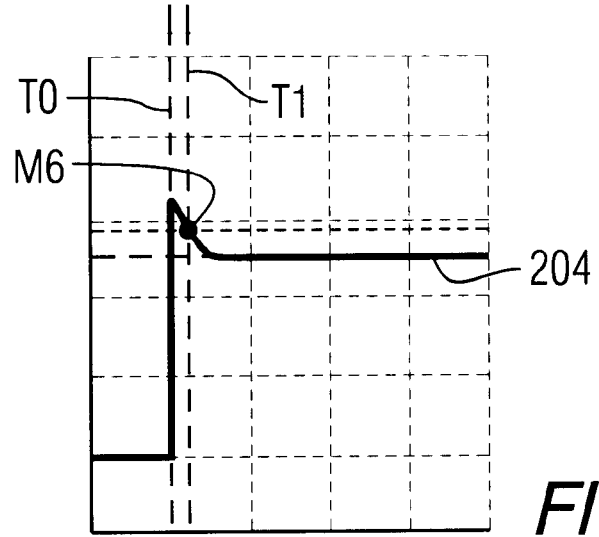
Figure 7C:
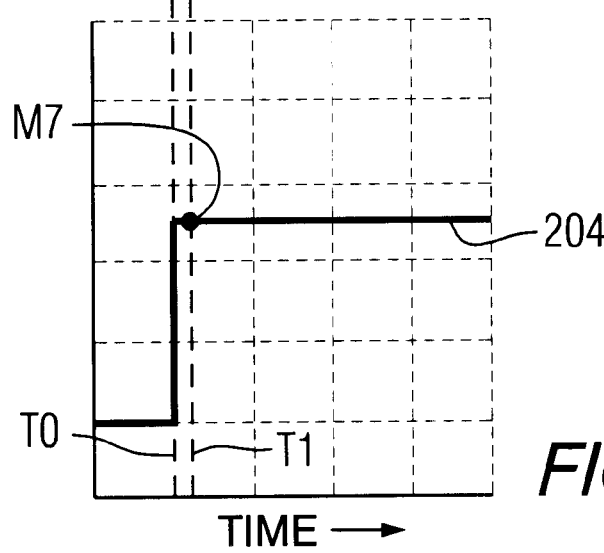

FIGS. 7A–7C will be used to illustrate how the circuit of the present invention determines whether or not the boat ground 32 is properly connected to the shore ground 34. In FIG. 7A, at time TX, the voltage 200 is held constant for a period of approximately 2.5 seconds. This is done to allow the current 204 to stabilize in order to make sure that the current value 204 has reached its minimum value according to the characteristic waveform 152 described above in conjunction with FIG. 5. The current is then removed for approximately 2.5 seconds. Then, at time T0, the voltage 200 is reapplied. FIG. 7A represents the resulting current 204 when the circuit is properly connected and the marine vessel 10 is in seawater and FIG. 7B shows the current 204 when the marine vessel is in fresh water. The current magnitude M5 shown in FIG. 7A is approximately 1.47 Amperes and the current magnitude M6, when the marine vessel 10 is in fresh water, is approximately 1.41 Amperes. As can be seen, the difference between seawater in FIG. 7A and fresh water in FIG. 7B is very slight.

In FIG. 7C, the cathodic protection circuit 30 has an open connection between the boat ground 32 and the shore ground 34. As a result, the sudden change in voltage 200 has a diminished effect on the current magnitude M7, which is approximately 1.25 Amperes. In this example, if a predetermined reference magnitude of 1.30 Amperes is used, the results in FIGS. 7A and 7B would be determined to be satisfactory, whereas the result in FIG. 7C would indicate an open ground connection which is an unsafe condition.

Figure 8:
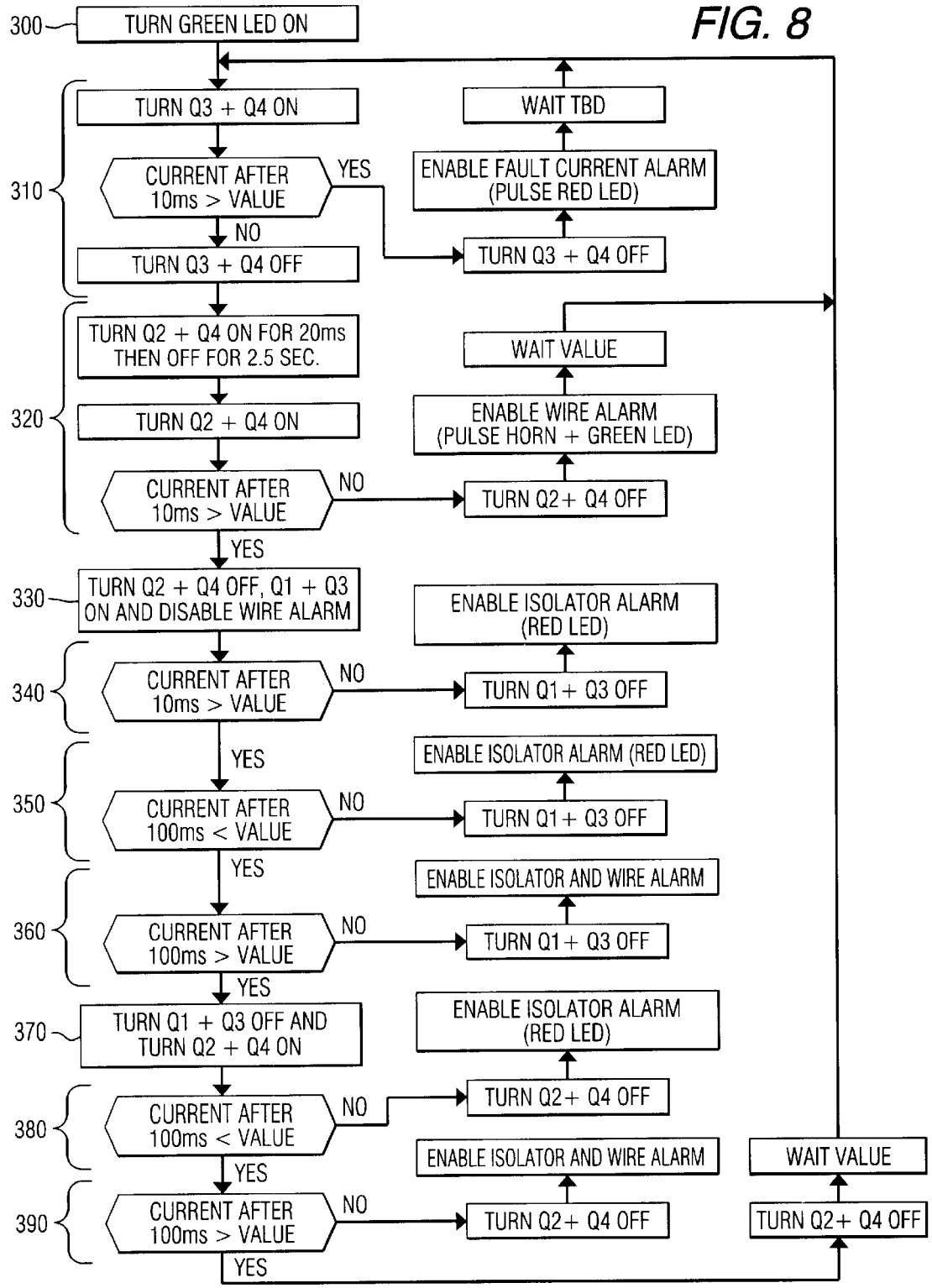
FIG. 8 is an exemplary flow chart of a program contained in the microprocessor of the present invention.

FIG. 8 represents an exemplary simplified flow chart showing the procedures performed by the microprocessor 80 of the present invention. In a preferred embodiment, the microprocessor would repeat the steps shown in the flow chart of FIG. 8 on a periodic cycle.

The flow chart of FIG. 8 shows the steps taken by the program in the microprocessor 80, with reference to the components identified in FIG. 3 and in Table I. As can be seen in FIG. 8, the program begins by initializing the system and turning the green LED on. Then a fault current test is begun. This portion of the flow chart is identified by reference numeral 310. Following the completion of the fault current test portion 310, the safety wire continuity test is performed in the portion of the flow chart identified by reference numeral 320. Functional block 330 begins the component integrity test. The interrogations represented by portion 340, 350, and 360 perform the open capacitor test, shorted diode test, and open diode test, respectively. Following this test, the H-bridge is switched to reverse the current direction through the current being tested. Then, as represented by flow chart portions 380 and 390, the shorted diode test and open diode test are performed, respectively. Functional blocks 330 and 370 represent the actions necessary to select and actuate the chosen direction of current flow through the H-bridge switching circuit 70. As can be seen in FIG. 8, the leftmost functional blocks represent preparatory actions and interrogations relating to the various tests performed by the present invention. The functional blocks represented in the central and rightmost portions of FIG. 8 represent actions taken as a function of the various interrogations, including various enunciator light and horn controls and various resetting steps relating to the H-bridge switching circuit 70. The steps represented in the flow chart of FIG. 8 are intended to be repeated at a frequency determined by a preselected time delay wait value as shown. This time delay magnitude would typically be selected as a function of the desired response speed of the system to a fault condition and the available time in the microprocessor's duty cycle. In the interrogation functional blocks of FIG. 8, several comparisons area shown where the electrical current is compared to a value. It should be understood that various different values can be selected for the specific tests performed by the present invention. It should also be understood that the magnitude of these comparison values are selected as a function of the type of circuit being tested by the present invention.

Although the present invention has been described in particular detail and illustrated to show one preferred embodiment, alternative embodiments are also within its scope.

I claim:

1. A method for testing an electrical system which is connectable between a shore power system and a marine vessel power system, comprising the steps of:

causing a voltage potential across said electrical system to change from a first generally constant magnitude to a second generally constant magnitude:

measuring a first magnitude of electrical current flowing through said electrical system a first preselected time period subsequent to said causing step; and determining the operating condition of said electrical system, as a function of its capacitive current decay characteristic, by comparing the relative magnitudes of said first magnitude of electrical current and a first predetermined reference magnitude.

2. The method of claim 1, further comprising:

reversing said causing step by inducing said voltage potential across said electrical system to change from said second generally constant magnitude to a third generally constant magnitude:

measuring a second magnitude of said electrical current flowing through said electrical system a second preselected time period subsequent to said reversing step; and determining the operating condition of a diode of said electrical system as a function of the relative magnitudes of said second electrical current and a second predetermined reference magnitude.

3. The method of claim 2, wherein:

said reversing step is performed by a microprocessor.

4. The method of claim 2, wherein:

said second electrical current measuring step is performed by a microprocessor.

5. The method of claim 1, wherein:

said second predetermined reference magnitude is selected to identify a shorted diode within said electrical system.

6. The method of claim 1, wherein:

said second predetermined reference magnitude is selected to identify an open diode within said electrical system.

7. The method of claim 1, wherein:

said first predetermined reference magnitude is selected to identify an open ground connection within said electrical system.

8. The method of claim 1, wherein:

said first predetermined reference magnitude is selected to identify an open capacitor within said electrical system.

9. The method of claim 1, wherein:

said causing step is performed by a microprocessor.

10. The method of claim 1, wherein:

said first electrical current measuring step is performed by a microprocessor.

11. The method of claim 1, wherein:

said determining step is performed by a microprocessor.

12. The method of claim 1, further comprising:

measuring a second magnitude of electrical current flowing through said electrical system a second preselected time period subsequent to said causing step; and determining the operating condition of said electrical system, as a function of diode voltage characteristic, by comparing the relative magnitudes of said second magnitude of electrical current and a second predetermined reference magnitude.

13. An apparatus for testing an electrical system which is connectable between a shore power system and of a marine vessel power system, comprising the steps of:

means for causing a voltage potential across said electrical system to change from a first generally constant magnitude to a second generally constant magnitude:

means for measuring a first magnitude of electrical current flowing through said electrical system a first preselected time period subsequent to said causing step; and means for determining the operating condition of said electrical system, as a function of its capacitive current decay characteristic, by comparing the relative magnitudes of said first magnitude of electrical current and a first predetermined reference magnitude.

14. The apparatus of claim 13, further comprising:

means for reversing said causing step by inducing said voltage potential across said electrical system to change from said second generally constant magnitude to a third generally constant magnitude:

means for measuring a second magnitude of said electrical current flowing through said electrical system a second preselected time period subsequent to said reversing step; and means for determining the operating condition of a diode of said electrical system as a function of the relative magnitudes of said second electrical current and a second predetermined reference magnitude.

\* \* \* \* \*